United States Patent [19]

Tamagaki et al.

[11] Patent Number: 5,077,574
[45] Date of Patent: Dec. 31, 1991

[54] IMAGE FORMING APPARATUS

[75] Inventors: Akira Tamagaki, Sokaku; Shougo Iwai, Moriyama, both of Japan

[73] Assignee: Sharp Kabushiki Kaisha, Osaka, Japan

[21] Appl. No.: 635,853

[22] Filed: Dec. 28, 1990

[30] Foreign Application Priority Data

Dec. 28, 1989 [JP] Japan ................................ 1-342984
Dec. 29, 1989 [JP] Japan ................................ 1-340552
Dec. 29, 1989 [JP] Japan ................................ 1-340553

[51] Int. Cl.$^5$ ...................... G03B 27/52; G03G 15/04
[52] U.S. Cl. ........................................ 355/40; 355/244
[58] Field of Search ................ 355/40, 24, 25, 45, 355/51, 244, 313

[56] References Cited

U.S. PATENT DOCUMENTS

| | | | |
|---|---|---|---|
| 3,523,725 | 8/1970 | Schaeffer | 355/40 X |
| 3,833,296 | 9/1974 | Vola et al. | 355/51 X |
| 3,957,368 | 5/1976 | Goshima et al. | 355/51 X |
| 3,988,063 | 10/1976 | McNair et al. | 355/40 |
| 4,059,355 | 11/1977 | Fritsch | 355/45 X |
| 4,077,714 | 3/1978 | Komori et al. | 355/51 |
| 4,080,064 | 3/1978 | Komori et al. | 355/51 |
| 4,110,030 | 8/1978 | Knechtel | 355/24 X |
| 4,247,192 | 1/1981 | Komori et al. | 355/25 X |
| 4,537,497 | 8/1985 | Masuda | 355/24 X |
| 4,998,131 | 3/1991 | Ueda et al. | 355/40 X |

FOREIGN PATENT DOCUMENTS 54-103023  8/1979  Japan .
58-182629 10/1983  Japan .
59-198442 11/1984  Japan .

*Primary Examiner*—Richard A. Wintercorn
*Attorney, Agent, or Firm*—David G. Conlin; Robert F. O'Connell

[57] ABSTRACT

An image forming apparatus which has a plurality of exposing optical systems used singly or jointly depending upon when an image is to be formed from different kinds of documents such as one is non-transmissive and the other is transmissive, or when a synthetic image is to be formed from different kinds of documents.

8 Claims, 15 Drawing Sheets

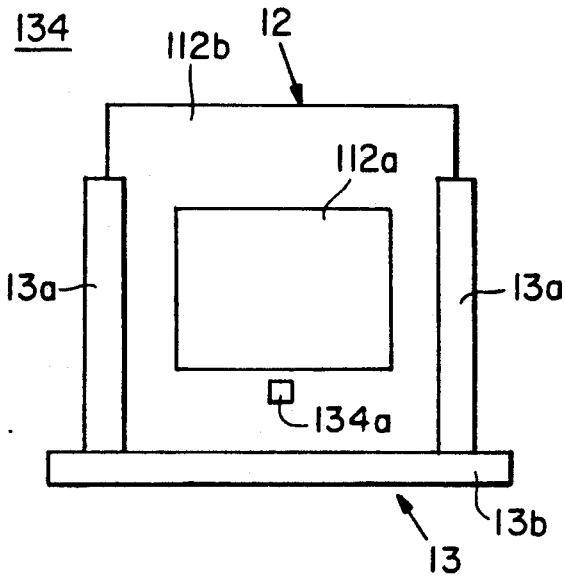
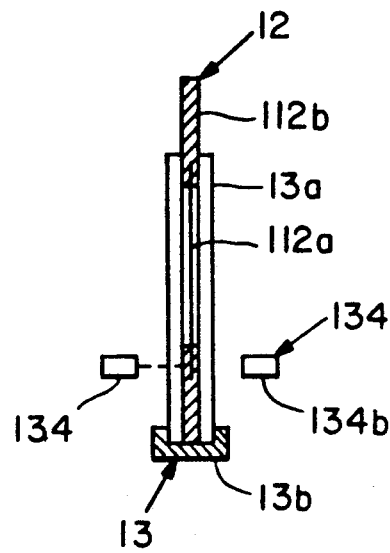
FIG. 13(a)  FIG. 13(b)
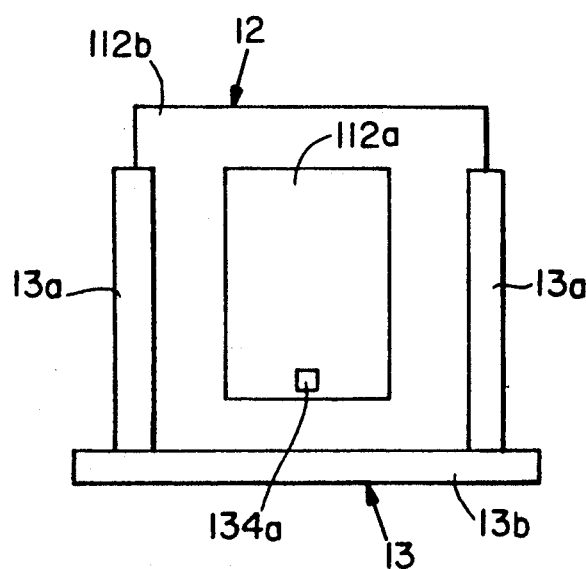
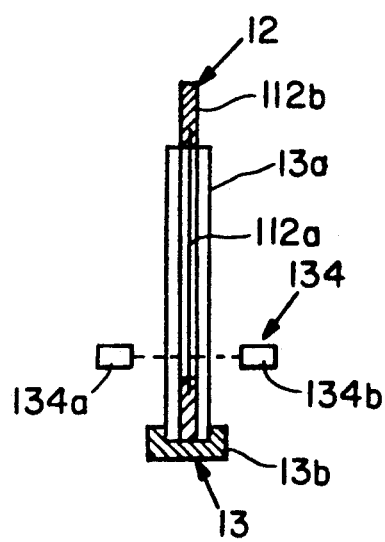
FIG. 14(a)  FIG. 14(b)

IMAGE FORMING APPARATUS

BACKGROUND OF THE INVENTION

1. Field of the Invention

The present invention relates generally to an image forming apparatus, and more particularly to an image forming apparatus which has a plurality of exposing optical systems usable when an image is to be formed from different kinds of documents, or when a synthetic image is to be obtained.

2. Description of the Prior Art

In general, copying machines fall roughly into two types; a first type is one in which an optical image is projected on a photosensitive drum of electrical conductivity previously charged, and the resulting latent image is developed with toner, followed by the transfer of the toner image onto a paper. A second type is one in which an optical image is projected onto a photosensitive sheet coated with photosetting microcapsules containing chromogenic materials to form a latent image by selectively hardened microcapsules. The photosensitive sheet is then pressed thereby rupturing unhardened microcapsules and allowing the chromogenic materials in the capsules to flow therefrom.

When different kinds of originals are copied, for example, one original being a normal paper with prints upon which light is reflected, and other being a slidefilm through which light is transmitted to obtain optical images, respectively, two optical systems are employed to expose the respective originals with the optical axes being partly shared by the two optical systems to guide optical images to the same exposure section. Solutions are proposed; Example (1) is disclosed in Japanese Laid-Open Patent Publication Nos. 58-182629 and 59-198442. They disclose a system under which a Fresnel lens, a screen and the like are placed on an original platen on which light rays transmitted through a slidefilm are projected, and the projected light rays are guided to the exposure section by an optical system housed in the copying machine. Example (2) is disclosed in Japanese Laid-Open Patent Publication No. 54-103023, under which a mirror is switched so as to guide light images from different originals to the same exposure section along the same optical axis.

In general, when light rays transmitted through slidefilms are guided to a photosensitive material so as to form an image, the whole surface of the slidefilm is illuminated by light rays from a light source and a slit is disposed in place on an optical path along which the transmitted light rays are guided to the photosensitive material so as to attain a slit exposure effect at an exposure section of the photosensitive material.

The known copying machines mentioned above are disadvantageous; in Example (1) the Fresnel lens, the screen, etc., have to be mounted on the original table when a slidefilm is copied and they have to be removed when a normal original is copied, thereby involving manual difficulty in switching the copy modes between the normal original and the slidefilm. Furthermore, a space is required to house the Fresnel lens, the screen, etc., when they are not used.

In Example (2), the optical axis along which the light image is directed to the exposure section must be changed by switching the mirror. It is difficult to achieve timely and exact mirror switching and angular adjustment. The optical axis is likely to deviate.

If the slidefilm is subjected to constant exposure to light, it is likely to discolor and/or deteriorate owing to the build-up of heat.

SUMMARY OF THE INVENTION

The image forming apparatus of this invention, which overcomes the above-discussed and numerous other disadvantages and deficiencies of the prior art, comprises a first exposing optical system, a second exposing optical system, a mode selection means for selecting the first exposing optical system or the second exposing optical system or both as a first mode, a second mode or a third mode, and an optical system control means for operating a selected mode wherein the first mode is to project light from a first document mounted on a first document holder onto a photosensitive material, the second mode is to project light from a second document mounted on a second document holder onto a photosensitive material, the third mode is to project light from the first document mounted on the first document holder onto a photosensitive material and project light from the second document mounted on the second document holder onto the area of the photosensitive material on which the first exposing optical system projects light so as to form a synthesized image on the photosensitive material.

In a preferred embodiment, the image forming apparatus comprises a first exposing optical system for projecting light from a first document mounted on a first document holder onto a photosensitive material, a second exposing optical system for projecting light from a second document mounted on a second document holder onto a photosensitive material, a mode selection means for selecting the first exposing optical system or the second exposing optical system or both as a first mode, a second mode or a third mode, and an optical system control means for operating the exposing optical systems in a selected mode wherein the first mode is to project light from a first document mounted on a first document holder onto a photosensitive material, the second mode is to project light from a second document mounted on a second document holder onto a photosensitive material, the third mode is to project light from the first document mounted on the first document holder onto a photosensitive material and project light from the second document mounted on the second document holder onto the area of the photosensitive material on which the first exposing optical system projects light so as to form a synthesized image on the photosensitive material, an optical shutter for cutting off the passage of light selectively, the optical shutter being disposed on the second exposing optical system, a control means for controlling the optical shutter in accordance with the operation of the optical system control means.

In a preferred embodiment, the image forming apparatus comprising a first exposing optical system, a second exposing optical system, a document detecting means for monitoring the presence of a document on the second document holder, and a mode selection means for selecting the first exposing optical system when the absence of a document on the second document holder is detected by the document detecting means and the second exposing optical system when the presence of a document on the second document holder is detected by the document detecting means.

In a preferred embodiment, the image forming apparatus comprising a first exposing optical system for projecting light from a first document mounted on a first document holder onto a photosensitive material, a second exposing optical system for projecting light from a second document mounted on a second document holder onto a photosensitive material, a selection means for selecting either the first exposing optical system or the second exposing optical system, a third optical system constituting as a part of the first exposing optical system or the second exposing optical system on a common optical path for the first exposing optical system or the second exposing optical system, the third optical system being adjustable so as to be optically operable with the first exposing optical system or the second exposing optical system, a document detecting means for monitoring the presence of a document on the second document holder, a mode selection means for selecting the first exposing optical system when the absence of a document on the second document holder is detected by the document detecting means or selecting the second exposing optical system when the presence of a document thereon is detected by the document detecting means, and a changeover means for changing the position of the third optical system so as to effect the optical cooperation with the selected exposing optical system.

In a preferred embodiment, the image forming apparatus comprising a first exposing optical system for projecting light from a first document mounted on a first document holder onto a photosensitive material, a second exposing optical system for projecting light from a second document mounted on a second document holder onto a photosensitive material, a selection means for selecting either the first exposing optical system or the second exposing optical system, a third optical system constituting as a part of the first exposing optical system or the second exposing optical system on a common optical path for the first exposing optical system or the second exposing optical system, a document detecting means for monitoring the presence of a document on the second document holder and/or the condition in which the document is held thereon, a mode selection means for selecting the first exposing optical system when the absence of a document on the second document holder is detected by the document detecting means or selecting the second exposing optical system when the presence of a document thereon is detected by the document detecting means, and a signaling means for generating a signal when the document is inappropriately held on the second document holder.

In a preferred embodiment, the image forming apparatus includes a heating means for heating the photosensitive material so as to stabilize the image quality thereon, and a control means for maintaining the temperature of the heating means at an optimum value.

In a preferred embodiment, the image forming apparatus includes a heating means for each of the first exposing optical system and the second exposing optical system so as to heat the photosensitive material independently.

In a preferred embodiment, the image forming apparatus includes a selection means for operating the heating means in accordance with an exposing optical system selected for the image forming operation.

Thus, the invention described herein makes possible the objectives of (1) providing an image forming apparatus adapted for use when different kinds of documents such as one being non-transmissive and the other being transmissive, (2) providing an image forming apparatus capable of incorporating an additional exposing optical system when it is necessary so as to form an image from different kinds of documents, (3) providing an image forming apparatus which forms a synthesized image from different kinds of documents, (4) providing an image forming apparatus which monitors the condition of a document held on a document holder and generates a signal when the document is inappropriately held thereon, thereby avoiding the continuation of an improper copying operation, and (5) providing an image forming apparatus which stabilizes the color density and tone of the resulting image, and makes the image glossy.

BRIEF DESCRIPTION OF THE DRAWINGS

This invention may be better understood and its numerous objectives and advantages will become apparent to those skilled in the art by reference to the accompanying drawings as follows:

FIG. 13(a) is a front view showing a state in which a permissive document is placed in its right posture on a document table;

FIG. 13(b) is a vertical cross-section through the document and the table;

FIG. 14(a) is a front view showing a state in which a permissive document is placed in its wrong posture on a document table;

FIG. 14(b) is a vertical cross-section through the document and the table;

DESCRIPTION OF THE PREFERRED EMBODIMENTS

Figure 1:
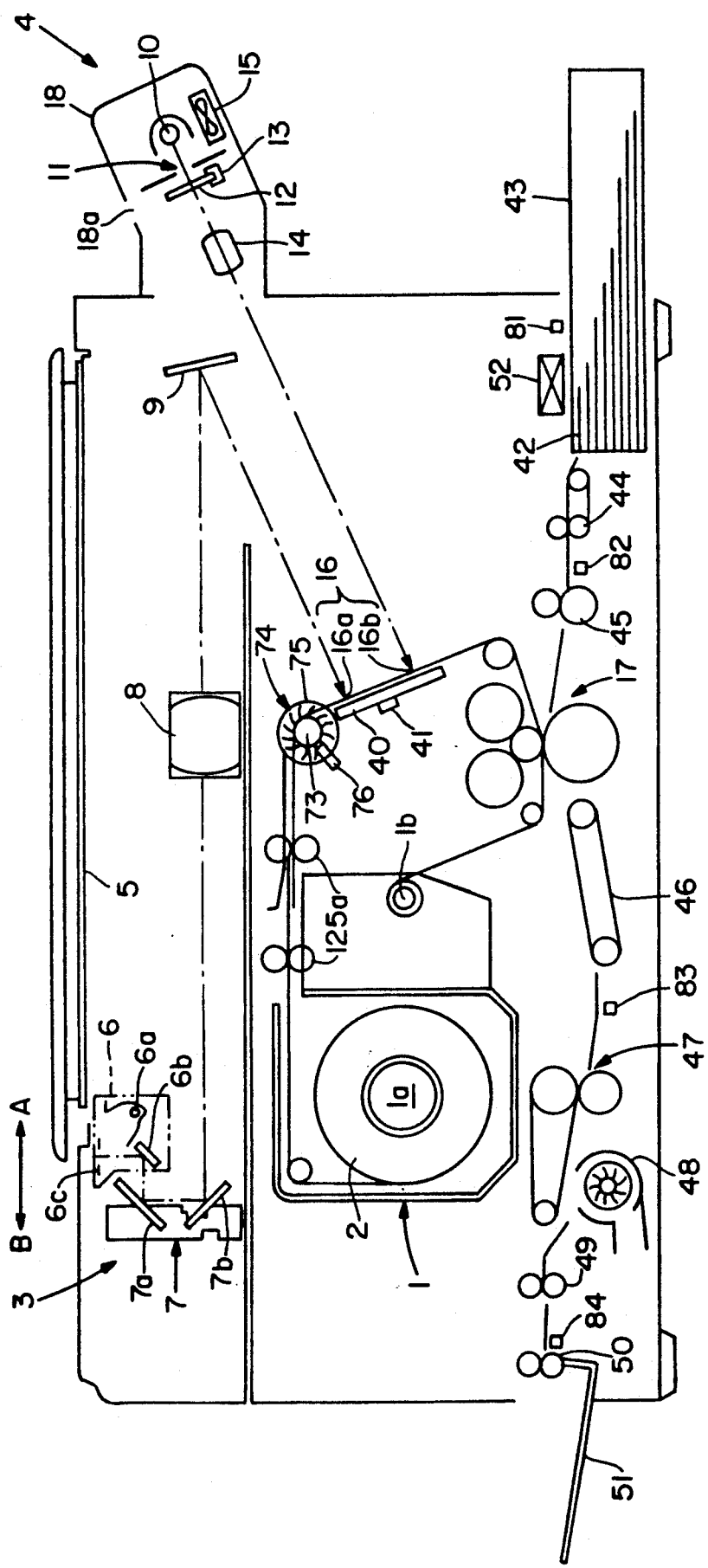
FIG. 1 is a schematic sectional view showing an image forming apparatus of this invention.

The image forming apparatus of the present invention will be described by way of a copying machine:

EXAMPLE 1

Referring to FIGS. 1 to 6, the illustrated copying machine is provided with a detachable cartridge 1 including a sheet supply shaft 1a and a takeup shaft 1b. A photosensitive sheet 2 (hereinafter referred to as the sheet) is mounted on the supply shaft 1a in a roll, and the sheet 2 is wound around the takeup shaft 1b through an exposing section 16, a pressure developing device 17, guide rollers and the like at a constant speed. The sheet 2 made of an aluminum film coated with photosensitive and pressure-sensitive pressure-rupturable microcapsules containing chromogenic materials. Such a sheet is the same as those disclosed in Japanese Laid-Open Patent Publication Nos. 58-88739 and 59-30539. The cartridge 1 is replaced with a fresh one after the whole photosensitive sheet 2 is wound around the takeup shaft 1b.

Above the cartridge 1 are provided a first exposing optical system 3 and a second exposing optical system 4. The first exposing optical system 3 is used to project light reflected from an untransmissive document placed on a first document table 5 onto the sheet 2. The second exposing optical system 4 is used to project light transmitted through a transparent document such as a slidefilm.

The first exposing optical system 3 is provided with an optical unit 6 including an exposing lamp 6a, a first mirror 6b, and a slit 6c, a second optical unit 7 including a second mirror 7a and a third mirror 7b, a zoom lens 8, and a fourth mirror 9. The first optical unit 6 is moved in the direction of A-B, and the second optical unit 7 is also moved in the direction of A-B at half the speed of the first optical unit 6. The zoom lens 8 is provided with a filter (not shown) whereby the color of the image is corrected. In the first exposing optical system 3 the light from a first lamp 6a is projected onto the portion of the sheet 2 that is situated on an upper exposure spot 16a in the exposure section 16 by way of the document placed on the document table 5, the slit 6c, the first mirror 6b, the second mirror 7a, the third mirror 7b, the zoom lens 8, and the fourth mirror 9, wherein the spread of the light is limited by the width $W_1$ of the slit 6c.

The second exposing optical system 4 is housed in a casing 18 projecting from the body of the copying machine, and includes a second lamp 10, a second slit 11, a document holder 13 for maintaining a transmissive document 12, a lens 14 for projecting light transmitted through the transmissive document 12 so as to form an image on the sheet 2, and a cooling fan 15 for cooling down the lamp 10 and its neighborhood. The casing 18 is provided with an opening 18a in its ceiling, so as to insert the transmissive document 12 therethrough to fix it to the document holder 13. Preferably, the opening 18a is closed except when the document holder 13 positions at an upper-limit position, which will be described below. In the second exposing optical system 4 a light from the second lamp 10 is projected onto the portion of the sheet 2 that is on a lower exposing spot 16b situated slightly below the upper exposing spot 16a, wherein the spread of the light is limited by the width $W_2$ of the second slit 11.

Figure 3:
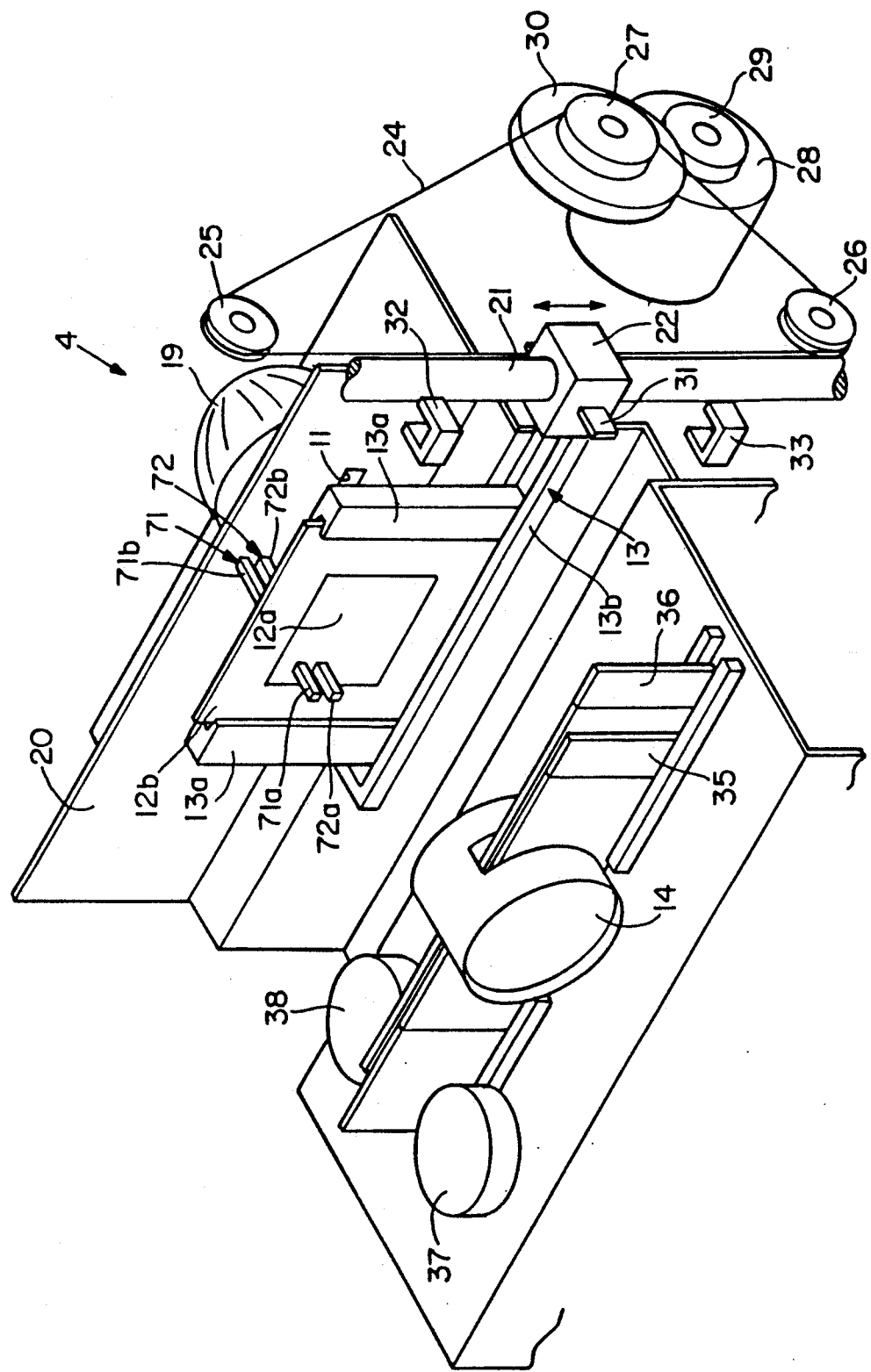
FIG. 3 is a perspective view illustrating a second optical exposing system shown in FIG. 2.

The second exposing optical system 4 is constructed as shown in FIG. 3. More specifically, the second lamp 10 is surrounded by a reflector 19, and the second slit 11 is produced in a plate 20 disposed in front of the second lamp 10. The document holder 13 is disposed in front of the slitted plate 20, the document holder 13 being constructed with a pair of pillars 13a and a transverse beam 13b. The document holder 13 is designed to maintain the transmissive document 12 which includes a document section 12a and a frame 12b. The document section 12a would contain, for example, a slidefilm.

The document holder 13 is secured to a block 22 slidable along a pair of rails 21 so that the document holder 13 moves up and down in accordance with the movement of the block 22. The block 22 is secured to a looped wire 24 that is carried on pulleys 25, 26 and 27. The drive of a motor 28 is transmitted to the block 22 through the gears 29 and 30, the pulleys 25 to 27 and the wire 24, thereby enabling a transmissive document 12 held by the document holder 13 to rise or lower. The block 22 is provided with a tongue 31 which is detected by an upper-limit sensor 32 and a lower-limit sensor 33, each sensor including a light emitter and a light receptor. When the tongue 31 shuts off light path between the light emitter and receptor, it is detected so as to send a signal indicating the position of the tongue 31. The motor 28 is driven in response to the signal, thereby rotating in a clockwise or a counter-clockwise direction. When the transmissive document 12 is absent on the document holder 13, it is arranged that the document holder 13 is positioned at the upper-limit position detected by the upper-limit sensor 32.

A first document-sensor 71 including a first light emitter 71a and a first light receptor 71b is disposed at the front of the document 12, and a second document-sensor 72 including a second light emitter 72a and a second light receptor 72b is disposed at the back thereof. Variations in the outputs of the first light receptor 71b and the second light emitter 72a monitors as to whether the transmissive document 12 is held in a right direction, a wrong direction, in a wrong posture or is not present during the movement of the document holder 13 toward the upper-limit position, which will be described in detail below.

A lens 14 is disposed in front of the transmissive document 12, having a pair of filters 35 and 36 for chromatic correction. They are driven by motors 37 and 38, thereby positioning appropriately in the optical paths.

Figure 4:
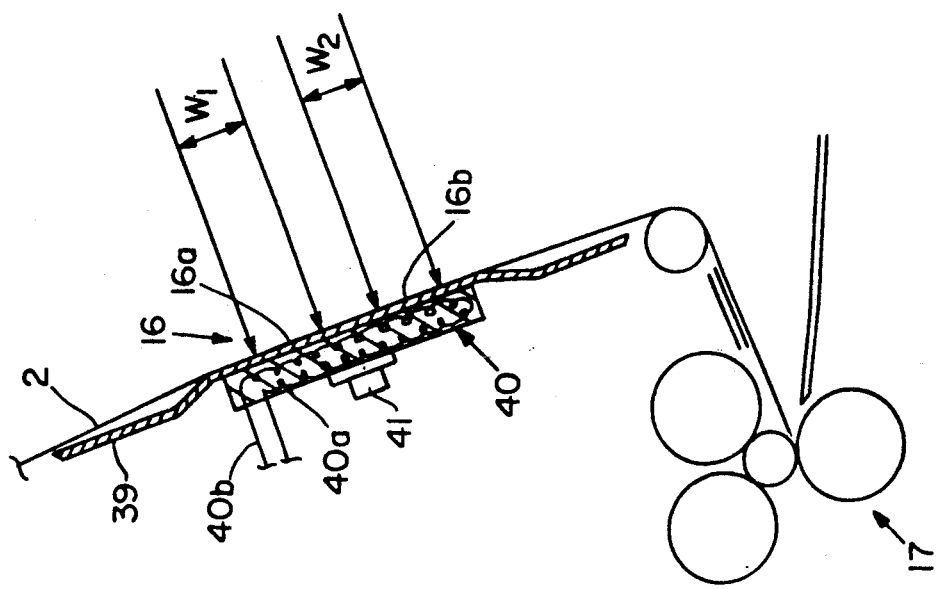
FIG. 4 is a perspective view illustrating the exposure section and the heater shown in FIG. 1.

Referring to FIG. 4, when the sheet 2 passes through the exposure section 16, it is supported by a guide plate 39 from its back. The guide plate 39 is provided with a heater 40 on its back so as to heat the sheet 2. The temperatures generated by the heater 40 is monitored by a thermistor 41. The heater 40 is constructed with a heating line 40b embedded in an insulating rubber member 40a, having length enough to cover the upper exposure spot 16a and the lower exposure spot 16b. The heater 40 is turned on or off in accordance with a temperature detected by the thermistor 41.

The heater 40 is used to stabilize the color density and tone characteristics of the resulting image. Otherwise, the photo- and pressure-sensitivity characteristics of the microcapsules contained in the sheet 2 would vary with heat, thereby resulting in unstable color density and tone. To avoid such problems, the heater 40 is used to maintain the sheet 2 at a predetermined temperature, for example, in a range of 35° C. to 45° C. As other than the photo-sensitive materials whose characteristics depend on heat, amorphous silicon, selenium, cadmium sulfide, zinc oxide, and organic substances can be used as photosensitive materials for electrophotographic copying machines.

The reference numeral 74 denotes a device for measuring the amount of feed of the sheet 2, the measuring device 74 being mounted on a roller 73, and including a slitted disc 75 having many slits, and a sensor 76 for detecting the individual slits. The number of slits detected by the sensor 76 is counted, thereby measuring the amount of feed of the sheet 2.

The reference numerals 43 and 51 denote a cassette for accommodating an image receiving sheet and a sheet discharging tray, respectively. Above the cassette 43 is disposed a suction device 52. Between the cassette 43 and the sheet discharging tray 51 are consecutively disposed feed rollers 44, timing rollers 45, a pressure developing device 17, a conveyor belt 46, a heat-setting device 47 equipped with a blower 48, feed rollers 49 and discharging rollers 50.

The cassette 43 accommodates an image receiving sheet 42, and can be replaced with a fresh one. The image receiving sheet 42 is coated with a developer that effects the coloring of the chromogenic material. The suction device 52 houses a fan whereby the image receiving sheet 42 is conveyed by suction. The pressure developing device 17, made of a metal pressure roller, ruptures the microcapsules contained in the sheet 2 remaining unhardened, thereby enabling the inside dyestuff to flow onto the image receiving sheet 42 so as to form an image thereon. The heat-setting device 47 heats the image receiving sheet 42, so as to facilitate the coloring of the dyestuff thereon, and melts the coating on the surface thereof so as to cover it uniformly with film. Thus, the image receiving sheet becomes glossy.

The cassette 43 is provided with a sensor 81 that detects the presence of the image receiving sheet stocked therein. The reference numerals 82, 83 and 84 denote sensors for detecting the passage of the image receiving sheet 42 so as to monitor any jamming.

Figure 5:
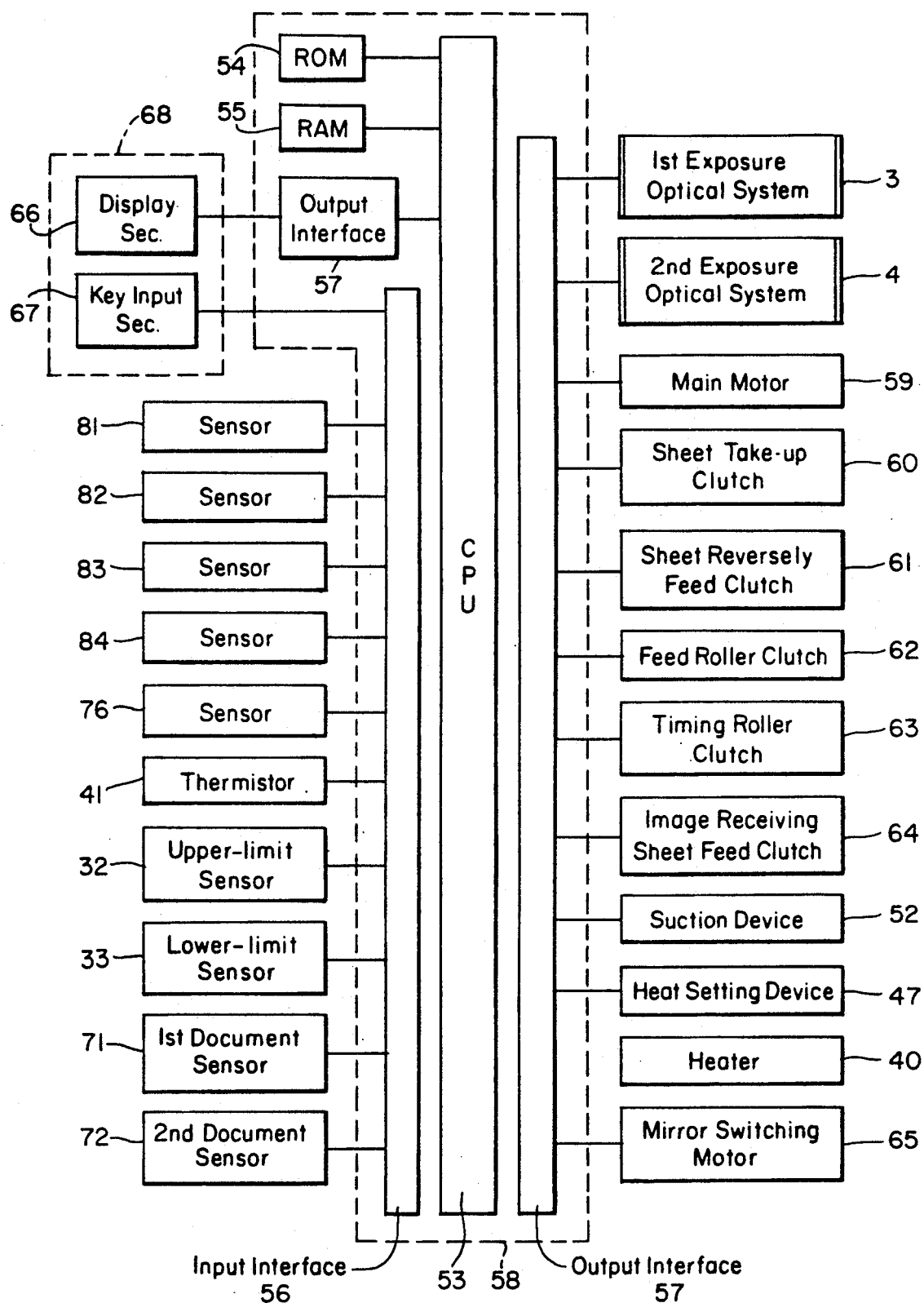
FIG. 5 is a block diagram showing the operation of the control section in the image forming apparatus of FIG. 1.

The copying machine is additionally provided with an operation board 68 including a display section 66 and a key input section 67. The key input section 67 includes a number of input keys as shown in FIG. 5; that is, mode selection keys for operating a first mode for using the first exposing optical system 3, a second mode for using the second exposing optical system 4, a third mode for using the first and second exposing optical systems 3 and 4, a key for setting a copy density, a key for setting a copying magnification, a key for setting the number of copies, a print switch for initiating the copying operation, a switch for stopping the copying operation, and other keys. The display section 66 indicates the states set by those keys in the input key board 67.

Referring to FIG. 5, the copying machine is provided with a control system 58 that includes a CPU 53, a ROM 54, a RAM 55, an input interface 56 and an output interface 57. The output interface 57 is connected to the first exposing optical system 3, the second exposing optical system 4, a main motor 59, a clutch 60 for taking up the sheet 2, a clutch 61 for reversely feeding the sheet 2, a feed roller clutch 62, a timing roller clutch 63, a clutch 64 for conveying the image receiving sheet, a suction device 52, a heat-setting device 47, a heater 40, a mirror switching motor 65, and a display 66. The input interface 56 is connected to sensors 81 to 84, and 76, a thermistor 41, an upper-limit position sensor 32, a lower-limit position sensor 33, a first-document sensor 71, and a second-document sensor 72.

Figure 2:
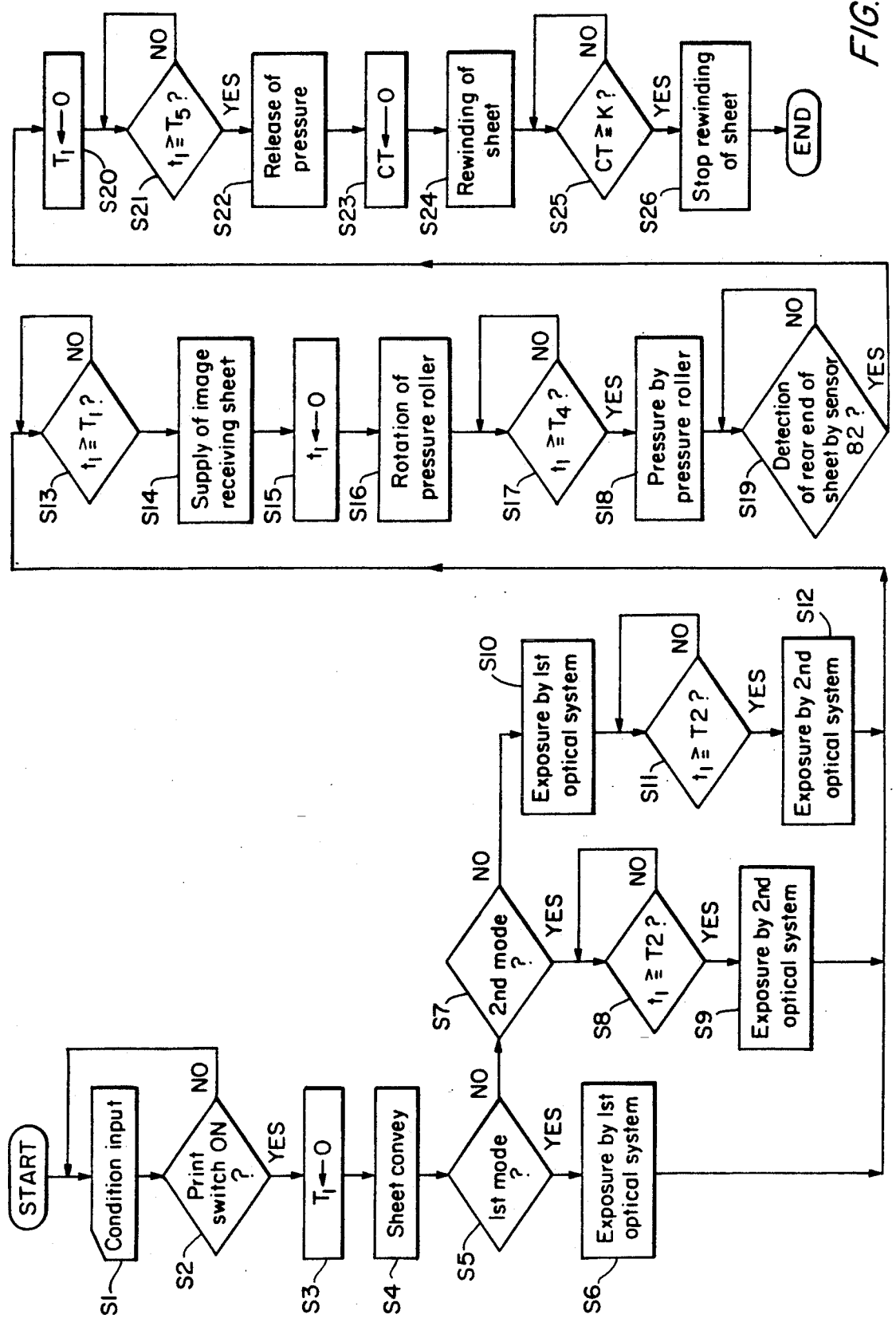
FIG. 2 is a flowchart illustrating the sequence of steps taken in the image forming process by the image forming apparatus of FIG. 1.

The CPU 53 regulates each step connected to the output interface 57 in accordance with inputs from the steps connected to the input interface 56, and a control program stored in the ROM 54, and also performs various controls shown in FIG. 2.

The main motor 59 drives the sheet supply shaft 1a, the sheet takeup shaft 1b, the pressure developing device 17, the feed rollers 44, the timing rollers 45, the conveyor belt 46, the heat-setting device 47, the conveyor rollers 49, and the discharging rollers 50. The sheet takeup clutch 60, the sheet reverse feeding clutch 61, a feed roller clutch 62, a timing roller clutch 63, and a clutch 64 for conveying the image receiving sheet are all intended to effect the connection or disconnection between the main motor 59 and the respective steps.

Referring to FIG. 2, a sequence for operations conducted under the construction described above will be described.

When a sheet-like document is to be copied by selecting the first mode with the selection key in the input key board 67 on the operation board 68, and using the first exposing optical system 3, the document is placed on a document table 5. Then, the print switch is turned on so as to scan the document by the lamp 6a, and light reflected from the document is projected onto the upper exposure spot 16a through the slit 6c, the first, second and third mirrors 6b, 7a and 7b, the zoom lens 8 and the fourth mirror 9.

When a transmissive document 12 is to be copied by selecting the second mode is selected by the mode selection key, and using the second exposing optical system 4, the transmissive document 12 is inserted through the opening 18a and secured to the document holder 13, which is raised by the motor 28, and maintained at the upper-limit position. The presence of the document holder 13 at this position is detected by the upper-limit sensor 32. The mount of the transmissive document 12 on the document holder 13 is detected by the first and second document-sensors 71 and 72.

When the print switch is turned on, the document holder 13 is driven by the motor 28, thereby causing it to lower to the lower-limit position. This descent is detected by the lower-limit sensor 33. At this stage, the document section 12a of the document 12 is at a lower position than the slit 11. Then, the lamp 10 is turned on, and the document 12 is moved up at a predetermined speed by the motor 28. A portion of the light from the lamp 10 that is transmitted through the slit 11 passes through the rising document 12, and is projected onto the lower exposure spot 16b through the lens 14 and the filters 35 and 36.

The light image scanned by the first exposing optical system 3 or the second exposing optical system 4 corresponding to the document section is projected onto a portion of the sheet 2 that is at the upper exposure spot 16a or the lower exposure spot 16b, while it is being wound around the takeup shaft 1b at a constant speed. At the exposure section 16 the sheet 2 advances in the direction C. The capsules present in the portion of the sheet 2 that is irradiated with the light are hardened. In this way the sheet 2 has a selective image formed area.

The cassette 43 sends out an image receiving sheet 42 by the suction device 52, so as to enable it to reach the pressure developing device 17 by way of the feed rollers 44 and the timing rollers 45. In the pressure developing device 17 the sheet 2 having the selectively image formed area and the image receiving sheet 42 are superimposed and pressed together. The capsules remaining unhardened in the sheet 2 are caused to rupture, thereby enabling the inside dyestuff to flow out. The dyestuff reacts with the developer contained in the image receiving sheet 42, and forms a color image on the image receiving sheet 42.

After the pressure development is finished, the sheet 2 is wound around the takeup shaft 1b, and the image receiving sheet 42 having the color image is subjected to rapid coloring by the heat-setting device 47, thereby becoming glossy. Then, the image receiving sheet 42 is cooled by the blower 48, and discharged onto the discharging tray 51 by way of the feed roller 49 and the discharging rollers 50.

When the third mode is to be performed, where the first and second exposing optical systems 3 and 4 are used so as to copy the transmissive document 12, the sheet-like document is placed on the document table 5, and the transmissive document 12 is secured to the document holder 13 in the above-mentioned manner. Then, the print switch is turned on, thereby guiding the light reflected from the sheet-like document onto the upper exposure spot 16a so as to effect the exposure of the sheet 2. When the light-exposed portion of the sheet 2 is moved to the lower exposure spot 16b, it is additionally exposed to the light transmitted through the transmissive document 12. In this way, the same area in the sheet 2 is exposed to the lights reflected from the sheet-like document and transmitted through the transmissive document 12, thereby ensuring that the superimposed two sheets have selectively image formed areas. Afterwards, the superimposed two sheets are subjected to the same process as that described above. Thus, an image resulting from the superimposition of the sheet-like document and the transmissive document is obtained.

When the copying is performed in the third mode, it is possible to place a color document on the document table 5 under the first exposing optical system 3, and to secure a transmissive slidefilm to the document holder 13 under the second exposing optical system 4, wherein the slidefilm allows light to pass through a DATE section thereof alone. In this way an image with the DATE is obtained. It is also possible to place a color document on the document table 5 under the first exposing optical system 3, and secure a slidefilm to the document holder 13 under the second exposing optical system 4 so as to transmit light through a desired portion therein alone. Thus, a color image can be obtained by copying a desired portion in the document.

Referring to FIG. 2, an example of the operation of the control system 58 will be described:

The key input section 67 is operated so as to input copying conditions and the first, second and third modes S1. When the print switch is turned on 2, the timer $t_1$ is reset to zero (S3), and the sheet winding clutch 60 is turned on. In this way the sheet 2 is fed at a predetermined speed (S4).

Then, the first exposing optical system 3 is operated by the mode selection key. it is detected whether the first mode is selected (S5). If the first mode is selected, the document is scanned under the first exposing optical system 3 (S6), the sequence advances to the next step S13.

If at the step S5 the first mode is not selected, it is detected whether the second mode is selected (S7). If the second mode is selected, after a predetermined period of time $T_2$ passes (S8), exposure is initiated under the second optical system 4 (S9), and the sequence advances to the next step (S13). The period of time $T_2$ is equal to a period of time for which the sheet 2 moves from the upper exposure spot 16a to the lower exposure spot 16b.

At the step S7, if the first mode is not selected, it is judged as the third mode being selected, and the document is scanned under the first exposing optical system 3 (S10). After a predetermined period of time $T_2$ passes (S11), exposure is performed under the second exposing optical system 4 (S12), and the sequence advances to the next step S13.

At the step S13, it is detected whether a predetermined period of time $T_1$ has passed after the feed of the sheet 2 is initiated. If the time $T_1$ passes, the timing roller clutch 63 is turned on so as to feed the image receiving sheet 42 to the pressure developing device 17 (S14). After the image receiving sheet 42 is fed, the timer $t_1$ is reset to zero (S15), and the pressure rollers in the pressure developing device 17 are driven (S16).

After a predetermined period of time $T_4$ passes (S17), where the forward end of the image receiving sheet 42 reaches the pressure developing device 17, the sheet 2 and the image receiving sheet 42 are pressed together by the pressure rollers of the pressure developing device 17 (S18).

When the sensor 82 detects the rearward end of the image receiving sheet 42 (S19), the timer $t_1$ is reset to zero (S20), and after a predetermined period of time $T_5$ passes (S21), the pressure rollers are released (S22). Then, the sheet takeup clutch 60 is turned off, and a counter CT is reset to zero (S23). Afterwards, the sheet reverse feeding clutch 61 is energized so as to reversely feed the sheet 2 (S24). The amount of sheet reverse fed is detected by counting output pulses from the sensor 76. When the number counted reaches a predetermined value K (S25), the reverse feeding of the sheet 2 is stopped (S26). The top end of the unused portion of the sheet 2 is positioned slightly upstream of the upper exposure spot 16a by the reverse feeding of the sheet 2.

Figure 6:
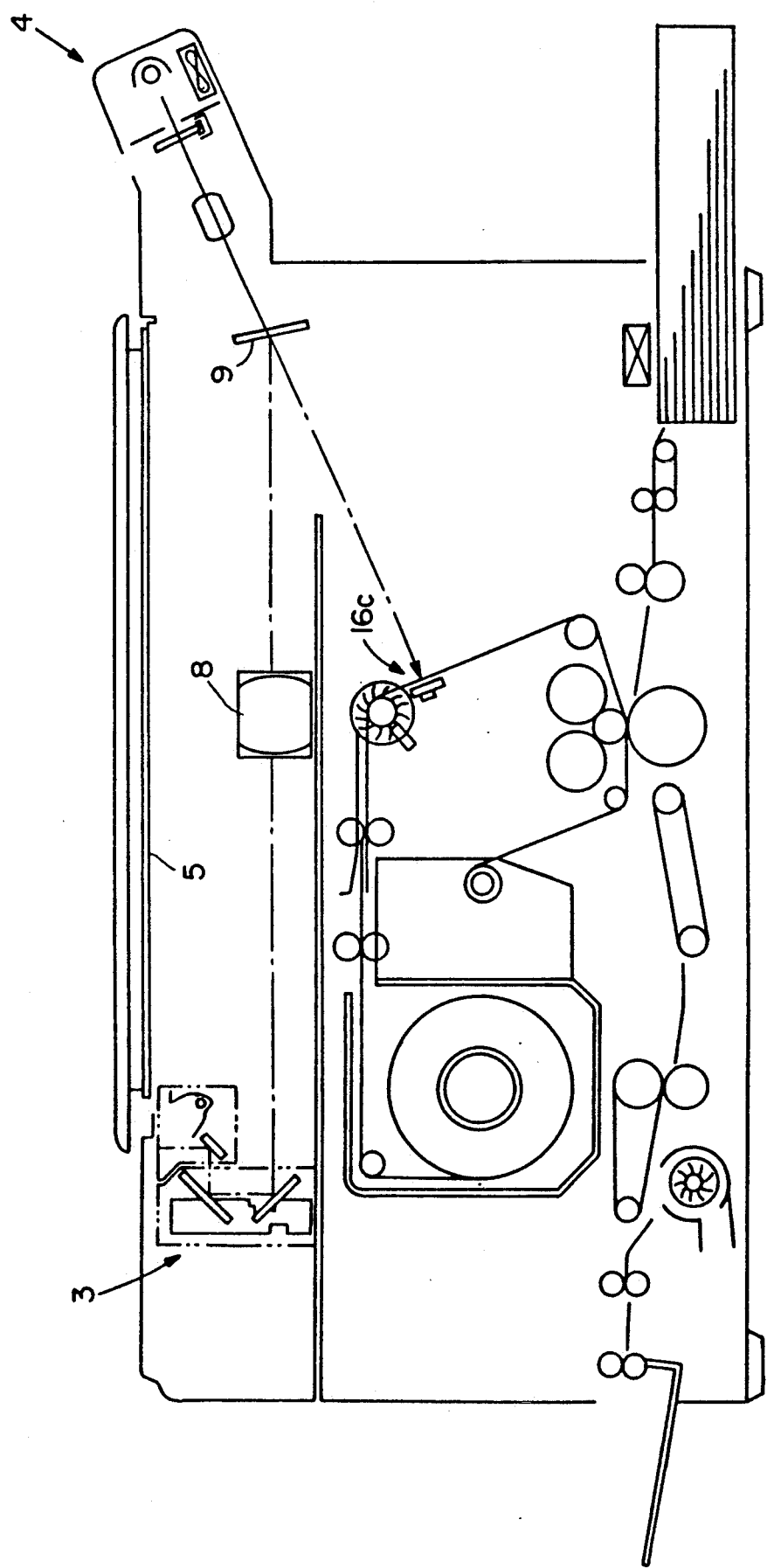
FIG. 6 is a schematic sectional view particularly showing the first optical exposing system and the second optical exposing system.
Figure 7:
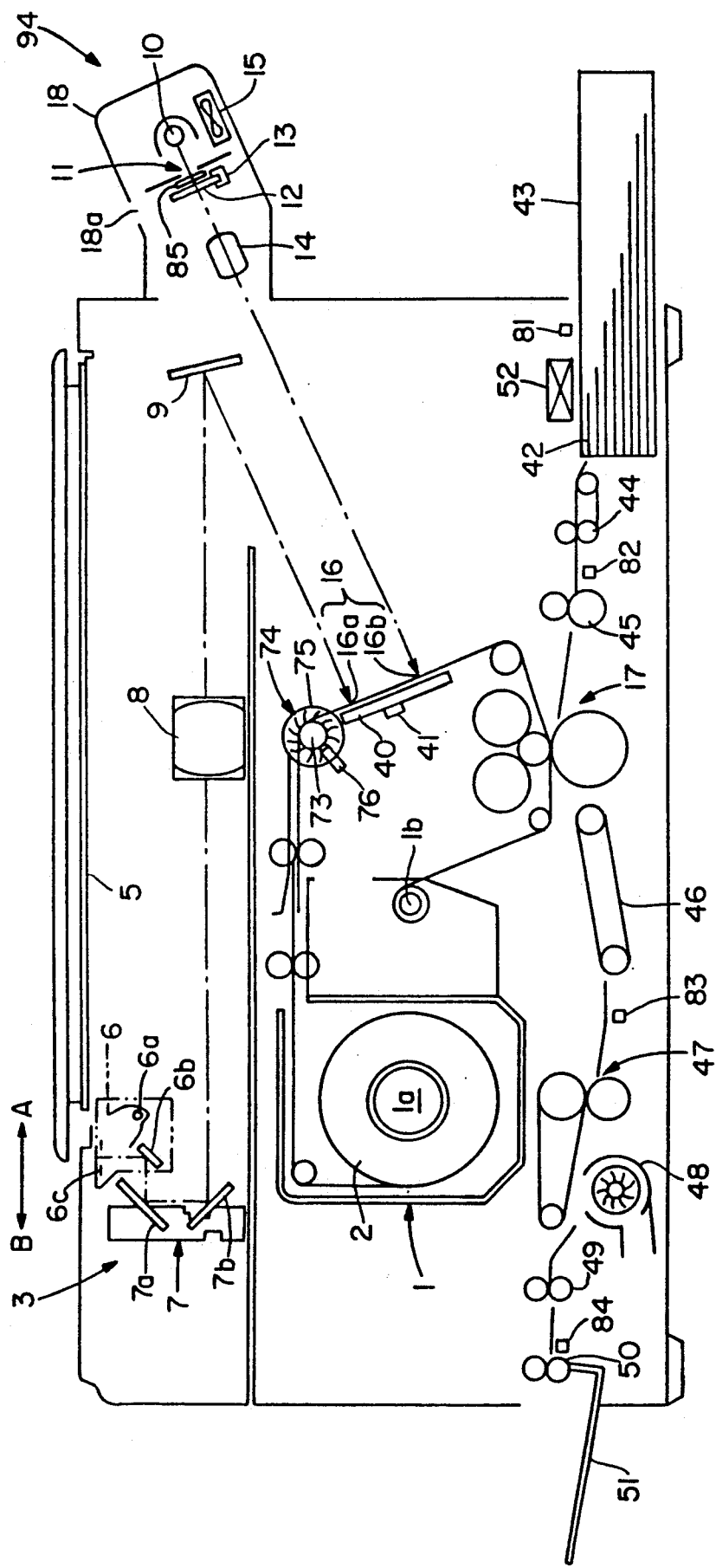
FIG. 7 is a schematic sectional view showing a modified version of the image forming apparatus of this invention.
Figure 8:
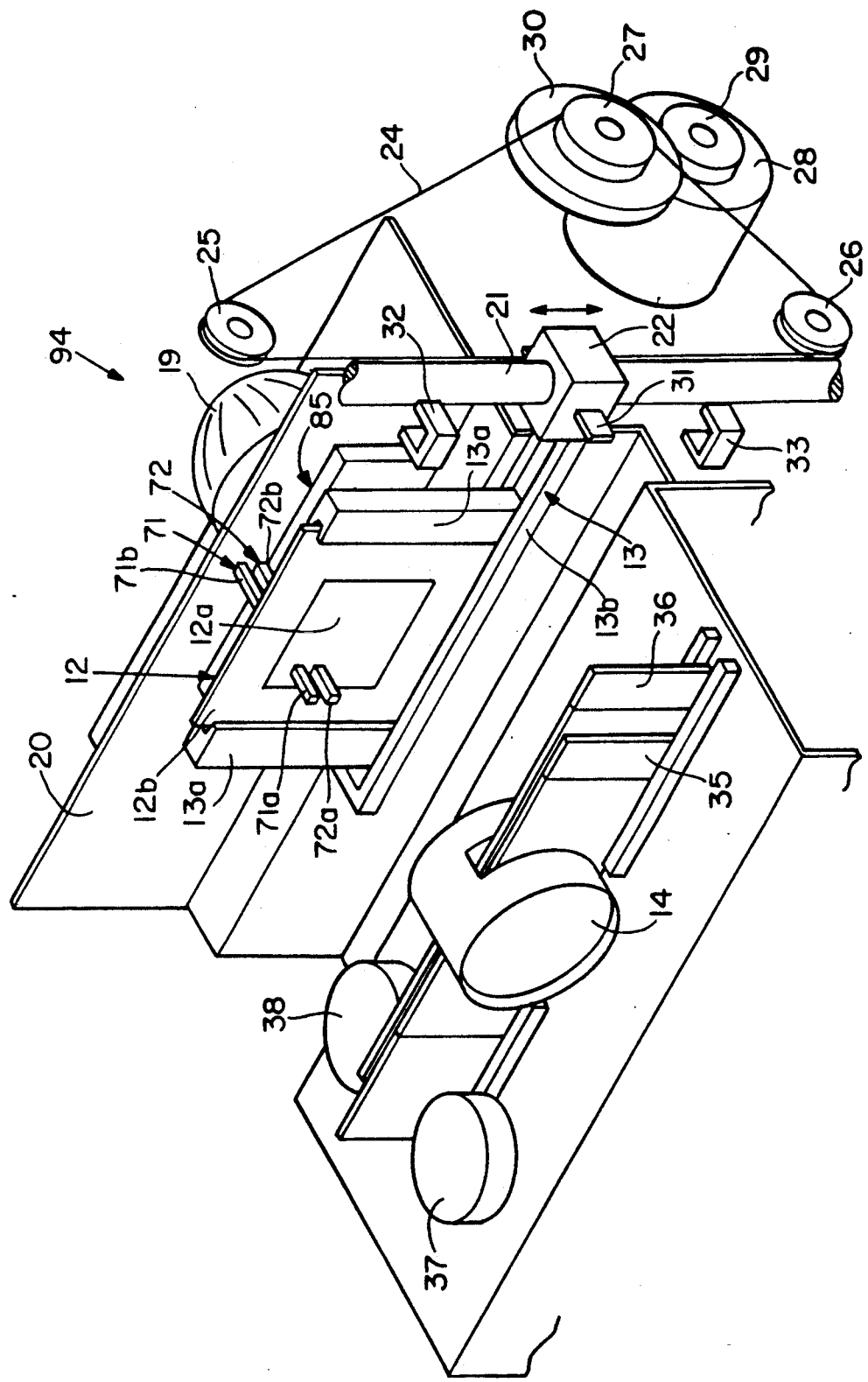
FIG. 8 is a perspective view illustrating the exposure section shown in FIG. 7.
Figure 9:
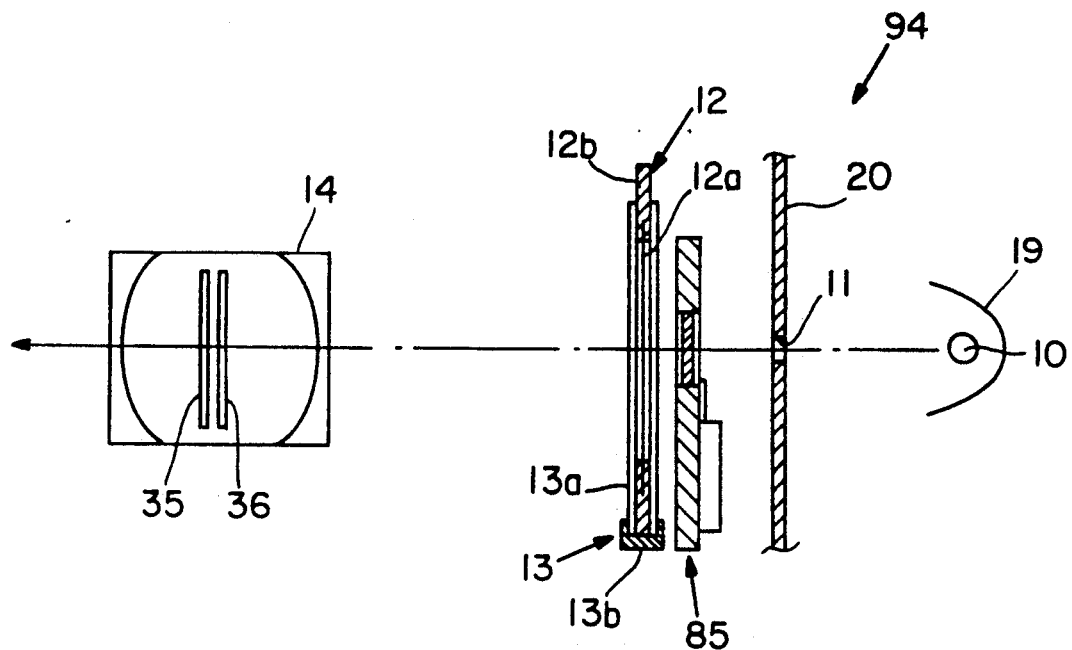
FIG. 9 is a schematic sectional view exemplifying the second optical exposing apparatus shown in FIG. 7.
Figure 12:
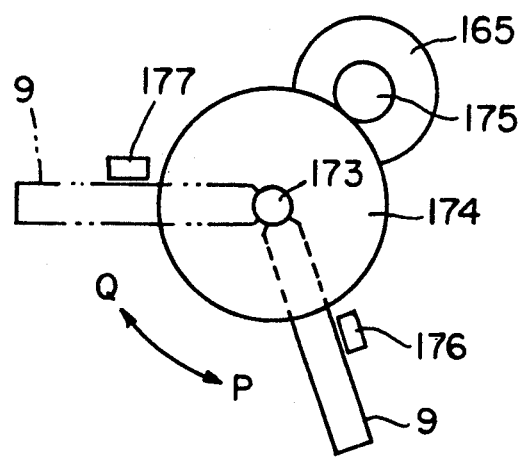
FIG. 12 is a diagrammatic view exemplifying a driving system and a position detecting system for a fourth mirror.

In the illustrated embodiment, the first exposing optical system 3 corresponds to the upper exposure spot 16a, and the second exposing optical system 4 corresponds to the lower exposure spot 16b, but the embodiment is not limited to this arrangement. As shown in FIG. 6, the first and second exposing optical systems 3 and 4 can correspond to the same exposure spot 16c, wherein the fourth mirror 9 is constructed with a half mirror.

EXAMPLE 2

Referring to FIGS. 2, 7 to 10, a modified version will be described, wherein like components and parts are indicated by like reference numerals to those in FIGS. 1 to 6:

This modified embodiment is characterized in that a second exposing optical system 94 is provided with a liquid crystal shutter 85 disposed in place between the slit 11 and the document holder 13.

Figure 10:
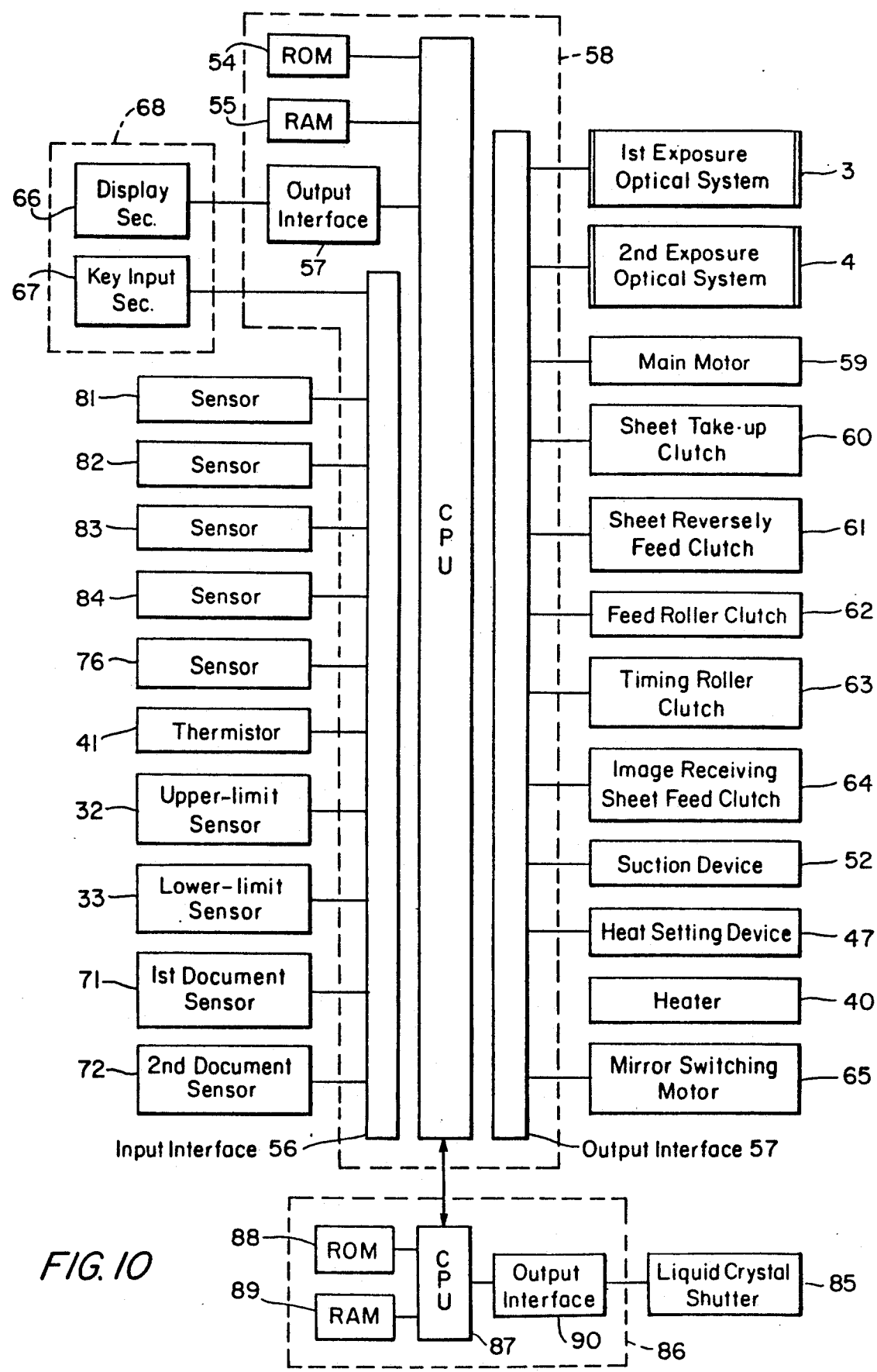
FIG. 10 is a block diagram showing the operation of the control section in the image forming apparatus shown in FIG. 7.

As shown in FIG. 10, the liquid crystal shutter 85 is connected to an output interface 90 of a liquid crystal control device 86 which includes a CPU 87 connected to the CPU 53 of the control system 58, a ROM 88, a RAM 89 and an output interface 90. The liquid crystal shutter constitutes an optical shutter control. The RAM 89 stores data about dates, time, names of sectins, name, etc., which are all to be synthesized with the image formed under the first exposing optical system 3. The data is called by operating the input key section 67 on the operation board 68. When the copying is performed in the third mode, the liquid crystal shutter 85 scrolls upward the data displayed on the liquid crystal shutter 85 in accordance with a moving speed of the sheet 2. The width of the liquid crystal shutter 85 may be slightly larger than that of the slit 11. The other structure is the same as that of Example 1.

When the first mode or the second mode is selected by the mode selection key, the copying is performed in the same manner as in Example 1.

When the third mode is selected to perform the copying, a sheet-like document is placed on the document table 5 under the first exposing optical system 3, and the key input section 67 is operated so as to select data displayed on the liquid crystal shutter 85. At this stage the transmissive document 12 is absent from the document holder 13. When the print switch is turned on, the light reflected from the sheet-like document is projected onto the upper exposure spot 16a so as to effect the exposure of the sheet. When the exposure spot in the sheet 2 is moved to the exposure spot 16b, it is additionally exposed to the light transmitted through the liquid crystal shutter 85. The data displayed on the liquid crystal shutter 85 is scrolled up in accordance with the movement of the sheet 2. In this way the same spot in the sheet 2 is exposed to the lights reflected from the sheet-like document and transmitted through the liquid crystal shutter 85, thereby forming a selective image formed area or areas from the superimposition of the sheet-like document and the liquid crystal shutter 85. Afterwards, the superimposed sheets are subjected to the same treatment as in Example (1), thereby obtaining a desired image on the image receiving sheet 42.

When the copying is performed in the third mode, it is possible to place a color photograph document on the document table 5 under the first exposing optical system 3, and to select data on the DATES displayed on the liquid crystal shutter 85 so as to allow light to pass through the selected DATE portion alone by controlling the liquid crystal shutter 85, a color image with a desired DATE is obtained. It is also possible to place a color photograph document on the document table 5 under the first exposing optical system 3, and control the liquid crystal shutter 85 so that light is transmitted through a desired portion therein alone. Thus, a color image can be obtained by copying a desired portion in the color document.

Referring to FIG. 2, the operation of the control system 58 over the first and second exposing optical systems 3 and 4 will be described:

When the copying conditions and the exposure mode are input (S1), and the print switch is turned on (S2), a timer $t_1$ is reset to zero (S3), and the sheet takeup clutch 60 is turned on. In this way the sheet 2 is fed at a predetermined speed (S4).

If the first mode is selected (S5), the document is scanned under the first exposing optical system 3 (S6), the sequence advances to the next step S13.

If the first mode is not selected at S5 but the second mode is selected (S7), exposure is performed under the exposing optical system 94 (S9) after a predetermined period of time $T_2$ passes (S8), and the sequence advances to the step 13.

If the first mode is not selected at S7, it is judged as the third mode being selected, and the document is scanned under the first exposing optical system 3 (S10). After $T_2$ passes (S11), exposure is performed under the second exposure optical system 94 (S12), and the sequence advances to step S13. At this stage, the liquid crystal shutter 85 is scrolled in accordance with a previously selected information.

The operation of steps S13 to S26 is the same as that in Example (1).

In this example, it can be arranged so as to ensure that the first and second exposing optical systems 3 and 4 expose the sheet 2 at the same exposure spot 16c to light.

EXAMPLE 3

Referring to FIGS. 11 to 16, a further example will be described, in which like components and parts are indicated by like reference numerals to those in Examples 1 and 2:

This example is characterized in the provision of a fourth mirror 9 which can be rotated to a working position when the first exposure optical system 3 is used so as to copy a sheet-like document. When the second exposing optical system 4 is used, it is rotated to a rest position. The structure of the fourth mirror 9 will be described in detail:

The fourth mirror 9 is secured to a rotary shaft 173 which is rotated by a motor 165 through gears 174 and 175 so as to move in either direction, P or Q, wherein the direction of P is a working position, and the direction of Q is a rest position. Whether the mirror 9 is at the working position or at the rest position is detected by sensors 176 and sensor 177, respectively. The fourth mirror 9 is positioned at the working position when the first exposing optical system 3 is selected.

As described above, when the second exposing optical system 4 is used, the document is placed in the document holder 13. At this stage, the fourth mirror 9 is rotated by the motor 165 in the direction P so as to take the working position. When the second exposing optical system 4 is used, the fourth mirror 9 is rotated by the motor 165 in the direction Q so as to take the rest position.

Referring to FIGS. 13(a), 13(b), 14(a) and 14(b), another method of detecting whether the transmissive document in the document holder is in a right direction, a wrong direction, or at a wrong posture or not present will be described:

The reference numeral 134 denotes a sensor for detecting the condition of the transmissive document 12 in the document holder 13, the sensor 134 including a light emitter 134a and a light receptor 134b. When the transmissive document 12 is mounted in the manner shown in FIGS. 13(a) and 13(b), the light from the light emitter 134a is cut by the frame 112b, thereby failing to reach the light receptor 134b. Thus, the output of the light receptor is off. When the transmissive document 12 is absent from the document holder 13, or when the transmissive document 12 is mounted in a wrong direction as shown in FIGS. 14(a) and 14(b), the light from the light emitter 134a is received by the light receptor 134b, the light receptor 134b is on. In this way the wrong posture, the wrong direction or absence of the transmissive document 12 on the document holder 13 is monitored.

Figure 11:
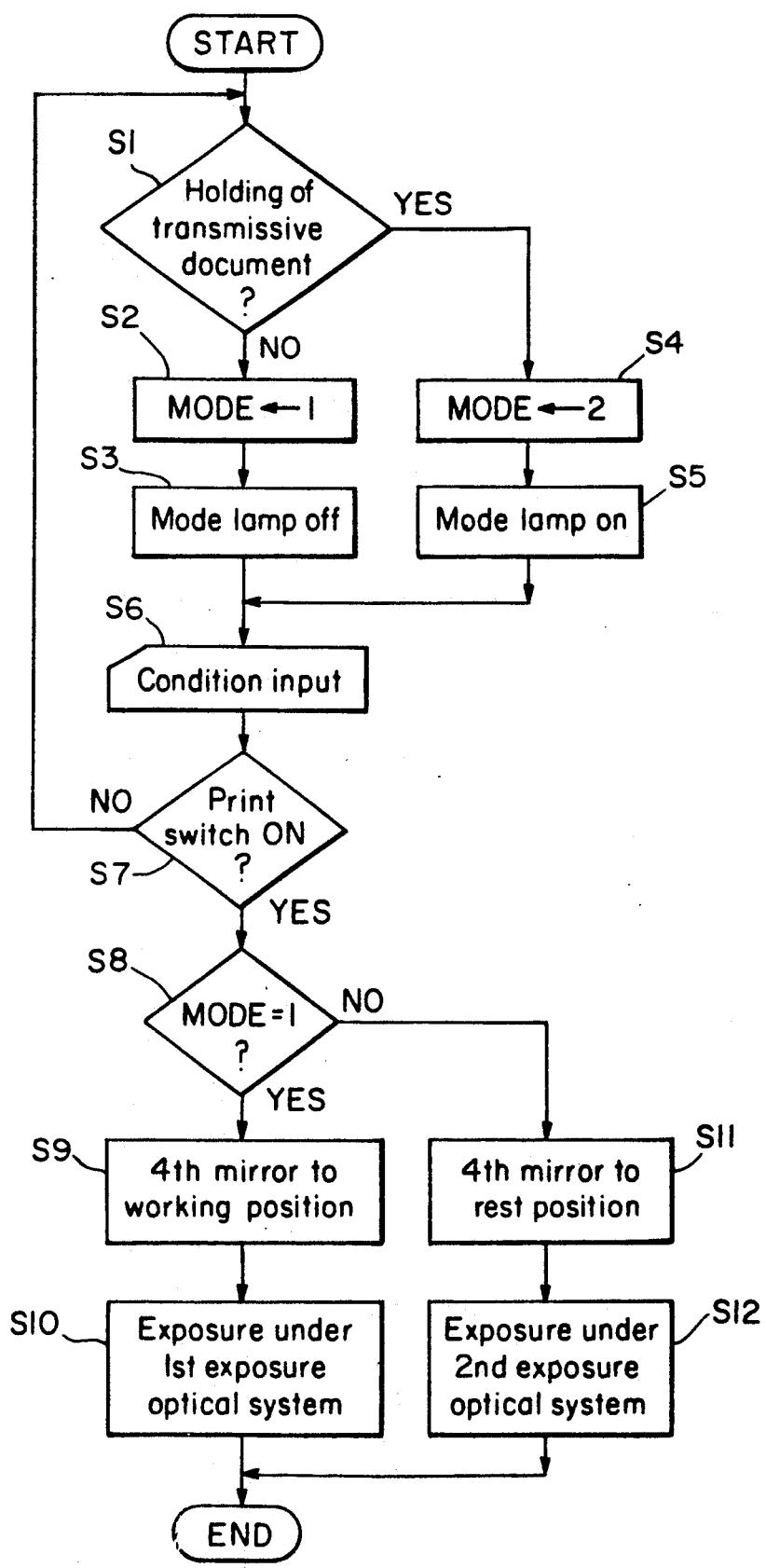
FIG. 11 is a flowchart showing a sequence of controlling the first optical exposing system and the second optical exposing system.

Referring to FIG. 11, an example of the operation of a control system 58 used in this example will be described:

The sensor 134 detects whether the transmissive document 12 is present on the document holder 13 (S1). If it is absent, "1" is input to the variable mode of the RAM 55 (S2). At this stage, the document holder 13 is raised to the upper-limit position by the motor 28. After a transmissive document mode lamp in the display section 66 is turned off (S3), the sequence advances to the next step S6.

If the transmissive document 12 is present on the document holder 13 at S1, "2" is input to the variable mode of the RAM 55 (S4) to turn on the transmissive document mode lamp (S5), and the sequence advances to the step S6.

After the key input section 67 is turned on, and desired copying conditions are input (S6), it is detected whether the print switch is turned on or not (S7). If it is not turned on, the sequence returns to the step S1. If it is turned on, it is judged whether the variable mode is "1" or "2" (S8). If it is "1", the fourth mirror 9 is rotated in the direction of P, that is, to the working position (S9), thereby allowing the exposure under the first exposing optical system 3 (S12).

If the variable mode is "2" at S8, the fourth mirror 9 is rotated in the direction of Q, that is, to the rest position (S11). Since the fourth mirror 9 is withdrawn to the rest position where it does not prevent the optical path between the transmissive document 12 and the sheet 2, it is easy to facilitate the changeover between the first exposing optical system 3 and the second exposing optical system 4. In addition, the heater 40 can be a small size. Furthermore, the fourth mirror 9 is moved after the print switch is turned on, thereby avoiding an unnecessary movement of the fourth mirror 9 when the transmissive documents 12 are exchanged.

When an image forming apparatus is only provided with the first exposing optical system 3, the second exposing optical system 4 can be easily added to the apparatus.

EXAMPLE 4

Figure 15:
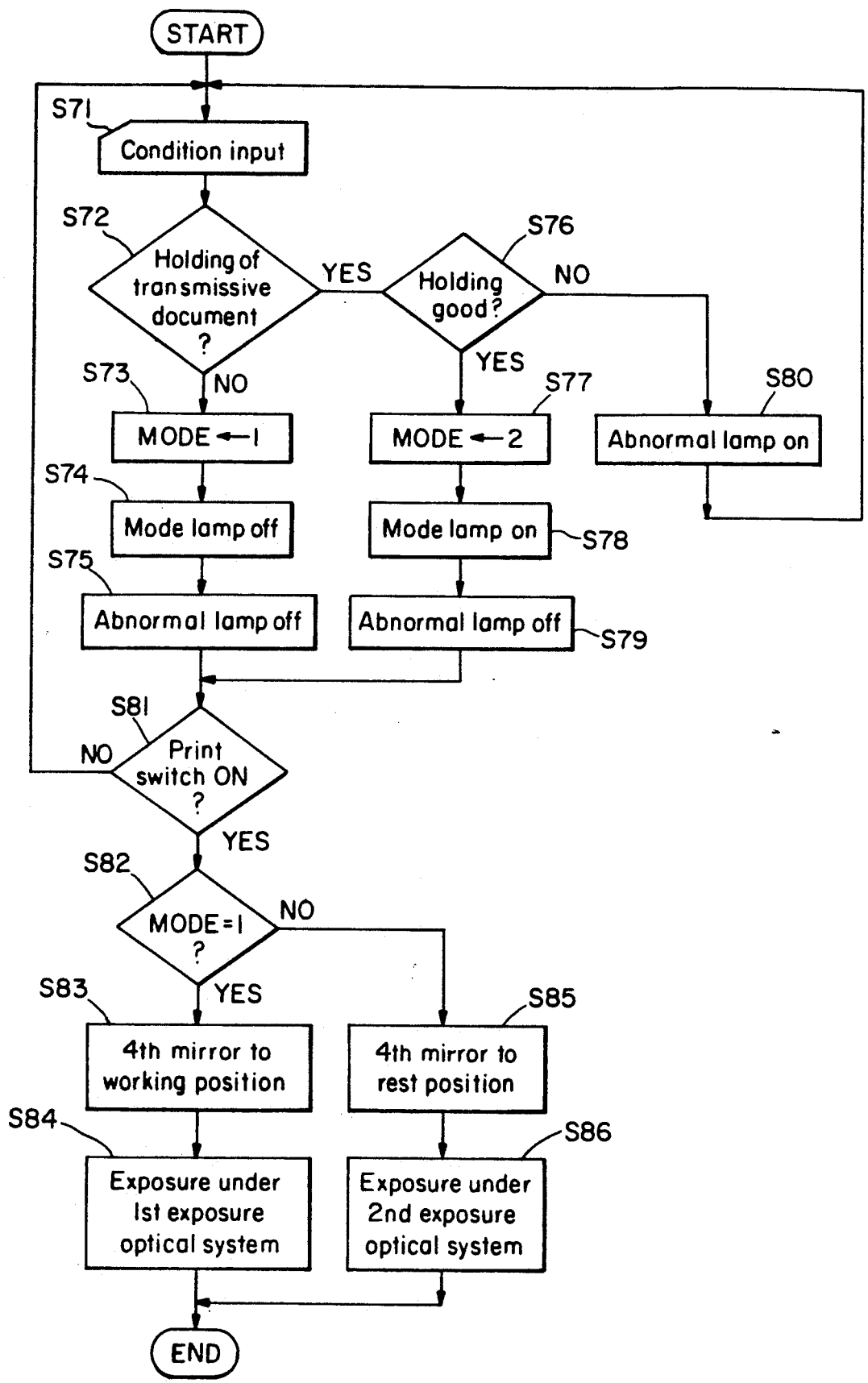
FIG. 15 is a flowchart showing a sequence for controlling the first optical exposing system and the second optical exposing system in a modified example of the embodiment.
Figure 16A:
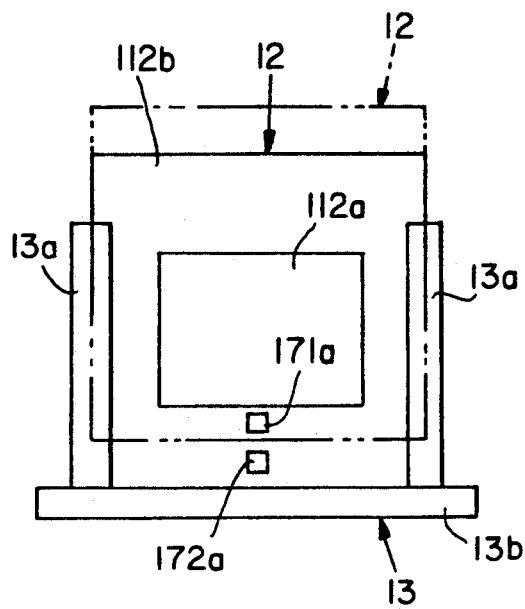
FIG. 16(a) is a front view showing a state in which a permissive document is placed in its right posture on a document table.
Figure 16B:
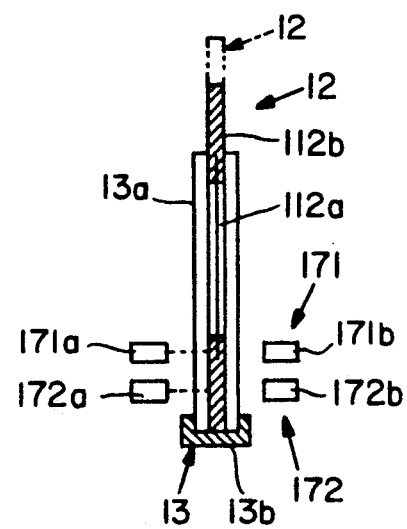
FIG. 16(b) is a vertical cross-section through the document and the table.
Figure 17A:
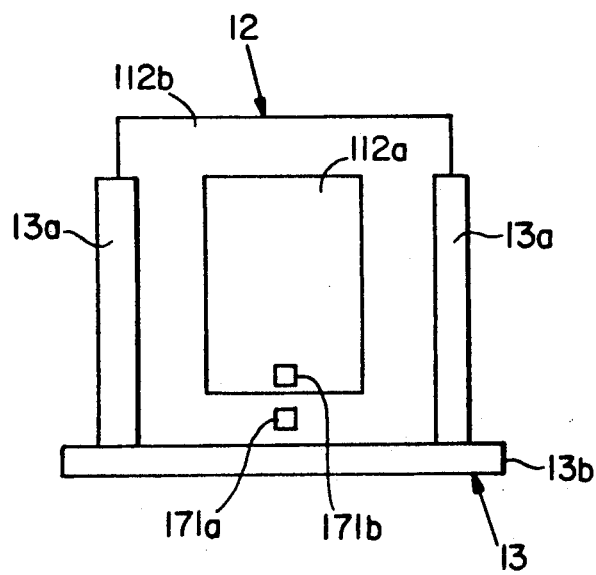
FIG. 17(a) is a front view showing a state in which a permissive document is placed in its wrong posture on a document table.
Figure 17B:
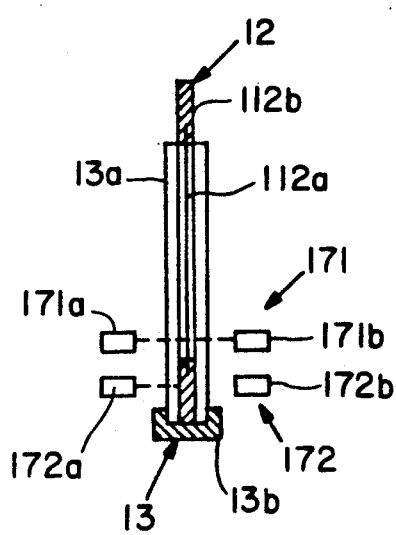
FIG. 17(b) is a vertical cross-section through the document and the table.
Figure 18:
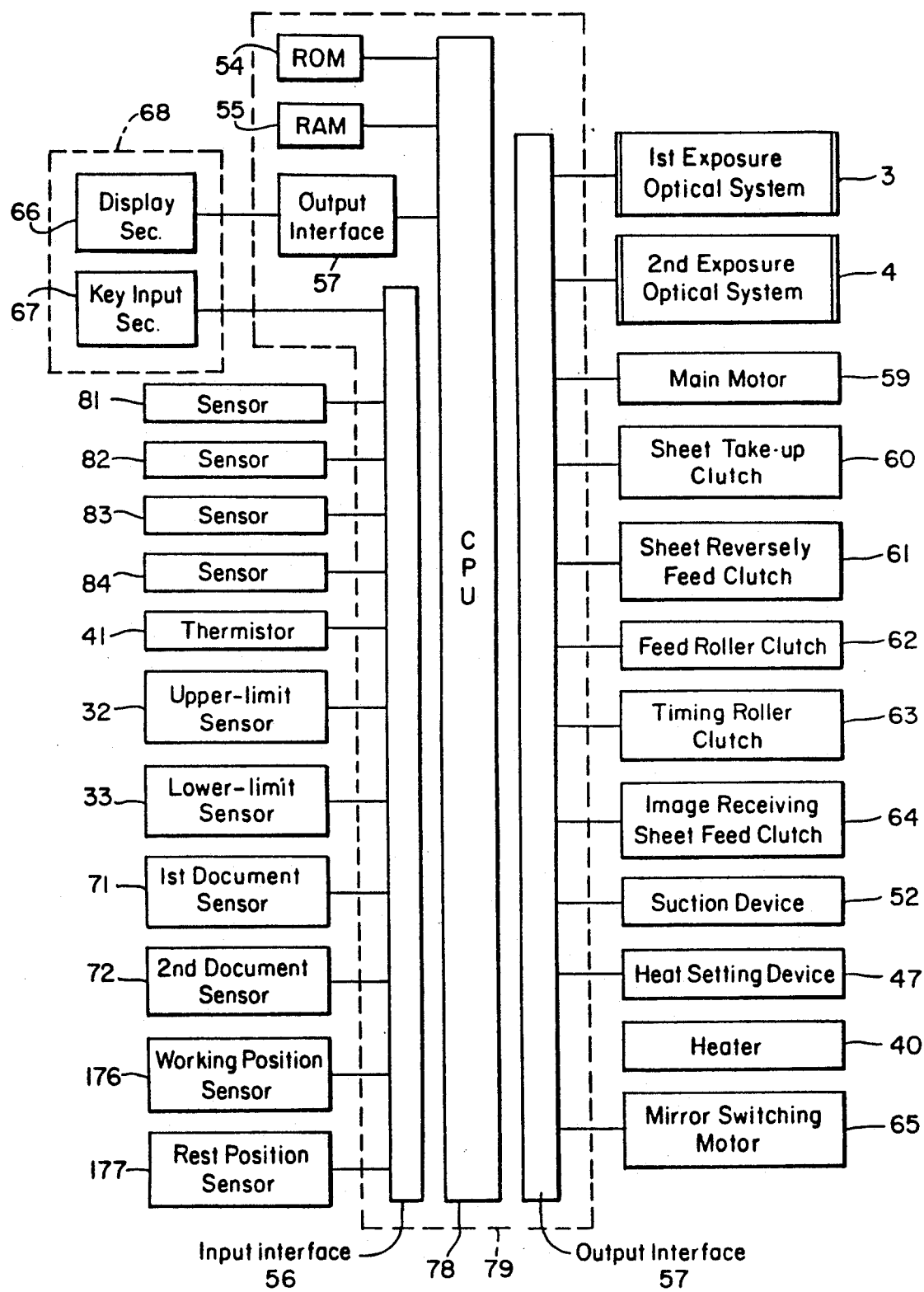
FIG. 18 is a block diagram showing a control system used in the modified example.

Referring to FIGS. 15 and 18, a fourth example of the embodiment will be described, in which like components and parts are indicated by like reference numerals to those in Examples 1 to 3:

The second exposing optical system 4 includes a first document sensor 171 including a first light emitter 171a and a first light receptor 171b, and a second document sensor 172 including a second light emitter 172a and a second light receptor 172b. The condition of the document on the document holder is monitored. The first and second document sensors 171 and 172 are located one above the other. When the document holder 13 is positioned at the upper-limit position, there are at least four cases; the first case is when the transmissive document 12 is placed in a right direction as shown by the full lines in FIGS. 16(a) and 16(b) (which is indicated "good" in Table 1, the second case is when it is placed at a wrong posture as indicated by the dotted lines in FIGS. 16(a) and 16(b) (which is indicated "poor"), the third case is when it is placed in a wrong direction (which is indicated "wrong direction"), and the fourth case is when no document is present (which is indicated "none"). The relationships between the cases 1 to 4 and the on/off conditions of the first and second light receptors 171a and 172b are shown in Table 1:

TABLE 1

| Condition | 1st light receptor | 2nd light receptor |
| --- | --- | --- |
| good | off | off |
| poor | off | on |
| wrong direction | on | off |
| none | on | on |

FIG. 18 shows a sequence of steps conducted by a control system used in this example. This sequence is different from that shown in FIG. 5, in that the operations of the working position sensor and the rest position sensor are added as steps 176 and 177.

Figure 19:
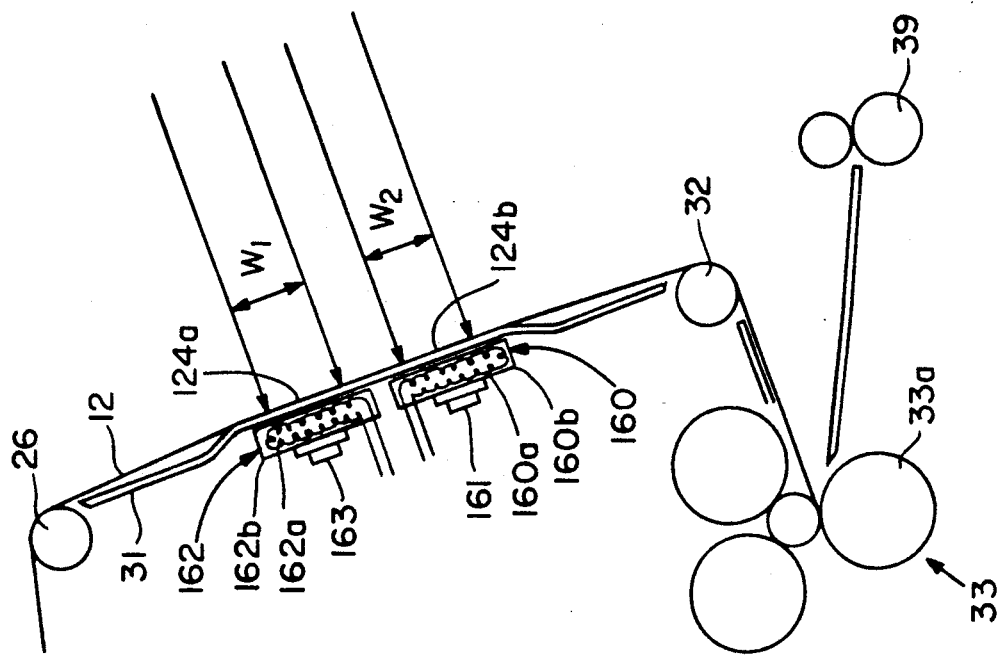
FIG. 19 is a perspective view illustrating modified versions of the exposure section and the heater.

FIG. 19 shows a modified version of the heater. The heater of this example includes two sections 162 and 160 which are independently energized such that when the first mode is selected, the first section 162 is energized, and that when the second mode is selected, the second section 160 is energized. The first section 162 heats the sheet 2 on a first exposure spot 124a, and the second section 160 heats the sheet 2 on a second exposure spot 124b.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An image forming apparatus comprising a first exposing optical system, a second exposing optical system, a mode selection means for selecting the first exposing optical system or the second exposing optical system or both as a first mode, a second mode or a third mode, and an optical system control means for operating a selected mode wherein the first mode is to project light from a first document mounted on a first document holder onto a photosensitive material, the second mode is to project light from a second document mounted on a second document holder onto a photosensitive material, the third mode is to project light from the first document mounted on the first document holder onto a photosensitive material and project light from the second document mounted on the second document holder onto the area of the photosensitive material on which the first exposing optical system projects light so as to form a synthesized image on the photosensitive material.

2. An image forming apparatus comprising a first exposing optical system for projecting light from a first document mounted on a first document holder onto a photosensitive material, a second exposing optical system for projecting light from a second document mounted on a second document holder onto a photosensitive material, a mode selection means for selecting the first exposing optical system or the second exposing optical system or both as a first mode, a second mode or a third mode, and an optical system control means for operating the exposing optical systems in a selected mode wherein the first mode is to project light from a first document mounted on a first document holder onto a photosensitive material, the second mode is to project light from a second document mounted on a second document holder onto a photosensitive material, the third mode is to project light from the first document mounted on the first document holder onto a photosensitive material and project light from the second document mounted on the second document holder onto the area of the photosensitive material on which the first exposing optical system projects light so as to form a synthesized image on the photosensitive material, an optical shutter for cutting off the passage of light selectively, the optical shutter being disposed on the second exposing optical system, a control means for controlling the optical shutter in accordance with the operation of the optical system control means.

3. An image forming apparatus comprising a first exposing optical system, a second exposing optical system, a document detecting means for monitoring the presence of a document on the second document holder, and a mode selection means for selecting the first exposing optical system when the absence of a document on the second document holder is detected by the document detecting means and the second exposing optical system when the presence of a document on the second document holder is detected by the document detecting means.

4. An image forming apparatus comprising a first exposing optical system for projecting light from a first document mounted on a first document holder onto a photosensitive material, a second exposing optical system for projecting light from a second document mounted on a second document holder onto a photosensitive material, a selection means for selecting either the first exposing optical system or the second exposing optical system, a third optical system constituting as a part of the first exposing optical system or the second exposing optical system on a common optical path for the first exposing optical system or the second exposing optical system, the third optical system being adjustable so as to be optically operable with the first exposing optical system or the second exposing optical system, a document detecting means for monitoring the presence of a document on the second document holder, a mode selection means for selecting the first exposing optical system when the absence of a document on the second document holder is detected by the document detecting means or selecting the second exposing optical system when the presence of a document thereon is detected by the document detecting means, and a changeover means for changing the position of the third optical system so as to effect the optical cooperation with the selected exposing optical system.

5. An image forming apparatus comprising a first exposing optical system for projecting light from a first document mounted on a first document holder onto a photosensitive material, a second exposing optical system for projecting light from a second document mounted on a second document holder onto a photosensitive material, a selection means for selecting either the first exposing optical system or the second exposing optical system, a third optical system constituting as a part of the first exposing optical system or the second exposing optical system on a common optical path for the first exposing optical system or the second exposing optical system, a document detecting means for monitoring the presence of a document on the second document holder and/or the condition in which the document is held thereon, a mode selection means for selecting the first exposing optical system when the absence of a document on the second document holder is detected by the document detecting means or selecting the second exposing optical system when the presence of a document thereon is detected by the document detecting means, and a signaling means for generating a signal when the document is inappropriately held on the second document holder.

6. An image forming apparatus according to any of claims 1 to 5, further comprising a heating means for heating the photosensitive material so as to stabilize the image quality thereon, and a control means for maintaining the temperature of the heating means at an optimum value.

7. An image forming apparatus according to claim 5, wherein the heating means is provided for each of the first exposing optical system and the second exposing optical system so as to heat the photosensitive material independently.

8. An image forming apparatus according to claim 7, further comprising a selection means for operating the heating means in accordance with an exposing optical system selected for the image forming operation.

* * * * *